(12) United States Patent
Zhang et al.

(10) Patent No.: US 10,338,174 B2
(45) Date of Patent: Jul. 2, 2019

(54) ROBUST DUAL ECHO DIXON IMAGING WITH FLEXIBLE ECHO TIMES

(71) Applicant: The Board of Trustees of the Leland Stanford Junior University, Palo Alto, CA (US)

(72) Inventors: Tao Zhang, Stanford, CA (US); Yuxin Chen, Stanford, CA (US); John M. Pauly, Stanford, CA (US); Shreyas S. Vasanawala, Stanford, CA (US)

(73) Assignee: The Board of Trustees of the Leland Stanford Junior Univesity, Palo Alto, CA (US)

( * ) Notice: Subject to any disclaimer, the term of this patent is extended or adjusted under 35 U.S.C. 154(b) by 224 days.

(21) Appl. No.: 15/352,420

(22) Filed: Nov. 15, 2016

(65) Prior Publication Data

US 2017/0234952 A1 Aug. 17, 2017

Related U.S. Application Data

(60) Provisional application No. 62/294,225, filed on Feb. 11, 2016.

(51) Int. Cl.
*G01R 33/48* (2006.01)
*G01R 33/561* (2006.01)
(Continued)

(52) U.S. Cl.
CPC ..... *G01R 33/4828* (2013.01); *G01R 33/5601* (2013.01); *G01R 33/5611* (2013.01); *G01R 33/56308* (2013.01); *G01R 33/56325* (2013.01)

(58) Field of Classification Search
CPC .......... G01R 33/4828; G01R 33/56308; G01R 33/5601; G01R 33/5611; G01R 33/56325
See application file for complete search history.

(56) References Cited

U.S. PATENT DOCUMENTS

2007/0285094 A1* 12/2007 Reeder ............... G01R 33/4828
324/313
2009/0261823 A1* 10/2009 Yu ....................... G01R 33/4828
324/307

(Continued)

OTHER PUBLICATIONS

Zhang et al., "Resolving Phase Ambiguity in Dual-Echo Dixon Imaging Using a Projected Power Method," Magnetic Resonance in Medicine, doi: 10.1002/mrm.26287, May 25, 2016; pp. 1-11.

*Primary Examiner* — Dixomara Vargas
*Assistant Examiner* — Zannatul Ferdous
(74) *Attorney, Agent, or Firm* — Beyer Law Group LLP (57) ABSTRACT

A method for creating a first MRI image and a second MRI image is provided. A first echo is read out. A second echo is read out. The first echo readout is used to generate a first image set, with each image pixel being a first linear combination of the first species and the second species. The second echo readout is used to generate a second image set, with each image pixel being a second linear combination of the first species and the second species. The first image set and second image set are combined to obtain a first combined image containing only the first species and a second combined image containing only the second species, comprising combining the first image set and the second image set to generate two pairs of solutions and using a mathematical optimization to choose a correct pair of solutions.

18 Claims, 6 Drawing Sheets

(51) Int. Cl.
*G01R 33/56* (2006.01)
*G01R 33/563* (2006.01)

(56) References Cited

U.S. PATENT DOCUMENTS

| | | |
|---|---|---|
| 2011/0026832 A1* | 2/2011 | LeMoigne-Stewart ...................... G06K 9/4633 382/199 |
| 2015/0204960 A1* | 7/2015 | Hamada ............. G01R 33/5617 324/309 |
| 2016/0231409 A1* | 8/2016 | Taviani .............. G01R 33/5611 |
| 2017/0097400 A1* | 4/2017 | Nakai .............. G01R 33/56554 |

* cited by examiner

ROBUST DUAL ECHO DIXON IMAGING WITH FLEXIBLE ECHO TIMES

CROSS REFERENCE TO RELATED APPLICATIONS

This application claims priority under 35 U.S.C. § 119 from U.S. Provisional Patent Application No. 62/294,225, filed Feb. 11, 2016, entitled "Robust Dual Echo Dixon Imaging with Flexible Echo Times", which is incorporated herein by reference for all purposes.

GOVERNMENT RIGHTS

This invention was made with Government support under contracts EB009690, EB015891, and EB019241 awarded by the National Institutes of Health. The Government has certain rights in the invention.

BACKGROUND OF THE INVENTION

This invention relates generally to magnetic resonance imaging (MRI). More specifically, the invention relates to MRI for measuring water and fat.

SUMMARY OF THE INVENTION

In accordance with an embodiment, a method for creating a first MRI image of an object in an MRI system indicating a first species and a second MRI image of the object indicating a second species is provided. A radio frequency (RF) excitation of the object is applied through the MRI system. A first echo from the object is read out through the MRI system. A second echo of the object is read out through the MRI system. The first echo readout is used to generate a first image set, with each image pixel of a plurality of image pixels being a first linear combination of the first species and the second species. The second echo readout is used to generate a second image set, with each image pixel being a second linear combination of the first species and the second species. The first image set and second image set are combined to obtain a first combined image containing only the first species and a second combined image containing only the second species, comprising combining the first image set and the second image set at each image pixel to generate two pairs of solutions at the same image pixel location and using a mathematical optimization of an image region to choose a correct pair of solutions that represents the first species and the second species at the same image pixel location.

In another manifestation, a method for creating a first MRI image of an object in an MRI system indicating a first species and a second MRI image of the object indicating a second species is provided. A plurality of radio frequency (RF) excitations of the object is applied through the MRI system. A plurality of first echoes from the object is read out through the MRI system. A plurality of second echoes of the object is read out through the MRI system. The readout of the plurality of first echoes is used to generate a first image set, with each image pixel of a plurality of image pixels of the first image set being a first linear combination of the first species and the second species. The readout of the plurality of second echoes is used to generate a second image set, with each image pixel of the plurality of image pixels of the second image set being a second linear combination of the first species and the second species. The first image set and second image set are combined to obtain a first combined image containing only the first species and a second combined image containing only the second species, comprising combining the first image set and the second image set at each image pixel to generate two pairs of solutions at the same image pixel location and using a mathematical optimization of an image region to choose a correct pair of solutions that represents the first species and the second species at the same image pixel location.

The invention and objects and features thereof will be more readily apparent from the following detailed description and appended claims when taken with the drawings.

DETAILED DESCRIPTION OF ILLUSTRATED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Dixon imaging offers robust water/fat separation in the presence of static field inhomogeneity. Due to chemical shift, water, and fat signals can be separated from multiple datasets acquired at different echo times. Among various Dixon techniques, dual-echo Dixon imaging is often desirable because of its high scan efficiency and flexibility.

A major challenge in dual-echo Dixon imaging is to estimate the phase error resulting from field inhomogeneity. Due to field inhomogeneity, two ambiguous phase error (or phasor) candidates can be analytically calculated at each image pixel. As field inhomogeneity is usually smoothly varying, different types of methods can be applied to resolve this phase ambiguity. The first type of these methods uses a region growing approach, in which initial seeds are identified first, followed by a sequential estimation of the phase error. The second type, such as regional iterative phasor extraction, applies a spatial smoothing to promote the smoothness of field inhomogeneity. The third type formulates the problem into a global optimization of smooth phase errors in local regions. These global optimization problems can be solved by graph cut and tree-reweighted messagepassing (TRW-S) algorithms and have shown to be robust in areas with large field inhomogeneity. However, these algorithms can be computationally intensive, especially for high dimensional datasets, such as three-dimensional (3D) datasets or dynamic MRI datasets.

In an embodiment, a binary quadratic optimization program is formulated to resolve the phase ambiguity in dual-echo Dixon imaging. A projected power method is proposed to efficiently solve the binary quadratic optimization. The embodiment has been validated in patient studies. Both the 1-peak fat model and 6-peak fat model are compared. Dual-echo Dixon imaging can be modeled as:

$$S_1 = (W + c_1 F) e^{i\phi_1}$$

$$S_2 = (W + c_2 F) e^{i\phi_2} \quad [1]$$

where $S_1$ and $S_2$ are complex composite signals acquired at two echo times, W and F are real-valued water and fat signals in image space, $c_1$ and $c_2$ are dephasing factors for fat with respect to water using a 1-peak fat model or multiple-peak fat model (usually known a priori) corresponding to the two echo times, and $\phi_1$ and $\phi_2$ are additional phases attributed to field inhomogeneity. In this work, the dephasing factors $c_1$ and $c_2$ are calculated by $$c_n = \Sigma_m w_m e^{i 2\pi \Delta f_m t_n}, \quad n=1,2 \quad [2],$$

where $t_n$ represents the echo times, $\Delta f_m$ is the resonance frequency offset for fat at different peaks of the fat model, and $w_m$ is the corresponding weighting that sums up to 1. For Dixon imaging with in-phase and opposed-phase echo times and a 1-peak fat model, $c_1$ and $c_2$ are simply +1 and −1, respectively, while for multiple-peak fat models, $c_1$ and $c_2$ may differ in both magnitude and phase. For the rest of this specification, a 6-peak fat model is applied to approximate the multifrequency fat spectrum. The frequency offsets (in ppm) and the corresponding weightings are: −3.80 (8.7%), −3.40 (69.3%), −2.60 (12.8%), −1.94 (0.4%), −0.39 (3.9%), and 0.60 (4.8%).

The main problem in dual-echo Dixon imaging is to estimate the phase error $\Delta\phi = \phi_2 - \phi_1$ (or phasor $P = e^{i\Delta\phi}$) between two echoes. Two pairs of solutions $(W_1, F_1)$ and $(W_2, F_2)$ can be obtained analytically, yielding two potential solutions for P:

$$P_1 = \frac{S_1^* S_2}{(W_1 + c_1^* F_1)(W_1 + c_2 F_1)} \quad [3]$$

$$P_2 = \frac{S_1^* S_2}{(W_2 + c_1^* F_2)(W_1 + c_2 F_2)}$$

The problem then converts to choosing the correct P from $P_1$ and $P_2$ at each image pixel. Methods like spatial smoothing, region growing, and global optimization can be applied to solve this problem. A global optimization can be formulated as:

$$\text{minimize } \Sigma_r \Sigma_{s \in N_r} v(P(r), P(s))$$

$$\text{subject to } P(r) \in \{P_1(r), P_2(r)\}, \forall r, \quad [4]$$

where r is an index of image pixels, P(r) indicates the phasor associated with the pixel r, s represents pixels in the neighboring pixel set $N_r$ of r, and v is a discontinuity cost function of phasor pair (P(r), P(s)). For example, a quadratic penalty with spatial weighting can be applied:

$$v(P(r), P(s)) = \frac{\min(|S_1(r)|, |S_1(s)|)}{d(r,s)} |P(r) - P(s)|^2, \quad [5]$$

where d(r, s) represents the Euclidean distance between r and s. Note that Eq. (4) is nonconvex and in general NP-hard.

In resolving phase ambiguity using a projected power method, Eq. (4) is reformulated into a binary quadratic optimization program. Specifically, define a vector variable $$X(r) = \begin{pmatrix} X_1(r) \\ X_2(r) \end{pmatrix} \in \left\{ \begin{pmatrix} 1 \\ 0 \end{pmatrix}, \begin{pmatrix} 0 \\ 1 \end{pmatrix} \right\}$$

for each pixel r, which indicates the binary selection of the phasor candidates.

Assume for 3D datasets, the image matrix size is $N_x \times N_y \times N_z$, then the dimensionality of X is $2N_x N_y N_z$. Eq. (4) can then be recast as:

$$\text{minimize}_X \; f(X) := X^T V X = \sum_{r,s} X(r)^T V(r,s) X(s) \quad [6]$$

$$\text{subject to } X(r) \in \left\{ \begin{pmatrix} 1 \\ 0 \end{pmatrix}, \begin{pmatrix} 0 \\ 1 \end{pmatrix} \right\}, \forall r,$$

where we use each sub-block $V(r,s) \in \mathbb{R}^{2 \times 2}$ of $V(r,s) \in \mathbb{R}^{2N_x N_y N_z \times 2N_x N_y N_z}$ to encode all four possible values of $v(\bullet, \bullet)$ for any pixel pair (r, s). To be more precise, for each pair (r, s) we set $$V(r,s) = \begin{cases} \begin{bmatrix} v(P_1(r), P_1(s)) & v(P_1(r), P_2(s)) \\ v(P_2(r), P_1(s)) & v(P_2(r), P_2(s)) \end{bmatrix}, & \text{if } s \in N_r \\ 0 & \text{Otherwise} \end{cases} \quad [7]$$

where $P_1(\bullet)$ and $P_2(\bullet)$ are the two phasor candidates at image pixel r and s. This ensures $$v(P(r), P(s)) = X(r)^T V(r,s) X(s) \forall s \in N_r, \quad [8]$$

justifying the equivalence between Eqs. (4) and (6).

Figure 1:
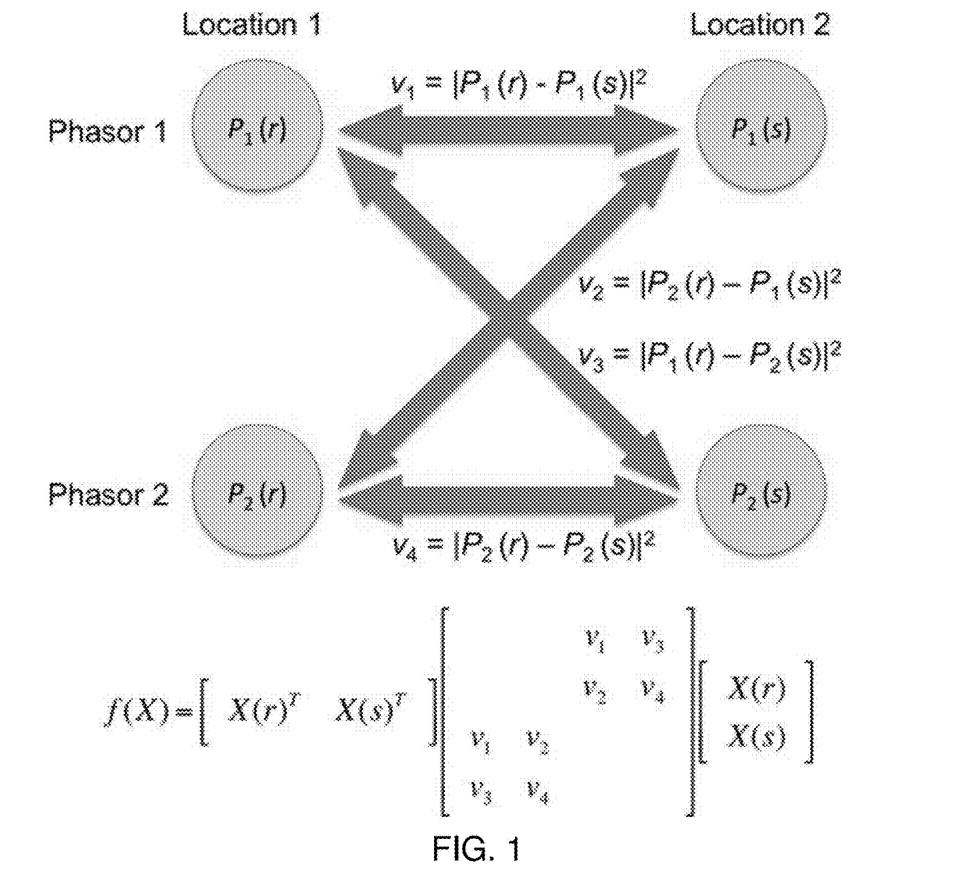
FIG. 1 shows an example of the formulation of the objective function in the proposed mathematical optimization.

FIG. 1 illustrates that all X(r) are concatenated into a long vector X. FIG. 1 shows an example of the formulation of the objective function in Eq. (6) with two image pixels. For simplicity, the spatial weighting and signal intensity weighting in Eq. (5) are ignored in FIG. 1. There are four different possible phasor choices for the image pixel pair. For each possible phasor pair, the corresponding smoothness penalty $(v_1, \ldots, v_4)$ is illustrated. Depending on the phasor selection indicated by the binary vector X, a large and sparse penalty matrix V can be formulated.

Figure 2:
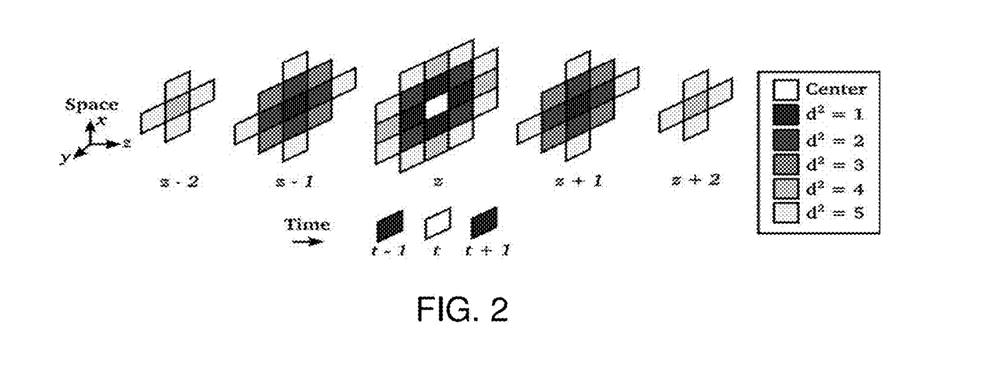
FIG. 2 is an illustration of the neighboring pixel set applied in an embodiment.

Throughout the specification, the default neighboring pixel is set as $N_r = \{s : d(r,s) \leq \sqrt{5}\}$ (56 pixels in 3D), and the spatial weighting in Eq. (5) was applied, as shown in FIG. 2. FIG. 2 is an illustration of the neighboring pixel set applied in an embodiment. For 3D datasets, 56 neighboring image pixels in space around the center image pixel ($N_r = \{s : d(r,s) \leq \sqrt{5}\}$) are included. For dynamic 3D datasets, two additional neighboring pixels in time are included. Neighboring pixels with different Euclidean distances are illustrated with different shades. Note that V is large but highly sparse, and VX can be implicitly represented as simple pixel-wise operations, as shown in the Appendix below. In this work, an iterative projected power method is developed to solve Eq. (6). The major steps are summarized below:

1. Set P(r) to unity (zero phase error), and initialize X $$X(r) = \begin{cases} \begin{pmatrix} 1 \\ 0 \end{pmatrix}, & |P(r) - P_1(r)| < |P(r) - P_2(r)| \\ \begin{pmatrix} 0 \\ 1 \end{pmatrix}, & \text{otherwise} \end{cases}, \forall r \quad [9]$$

2. Repeat until convergence or the iteration number reaches the maximum (by default 100):

a. Update $X \leftarrow VX$ b. Set $X(r) \leftarrow \begin{pmatrix} \frac{X_2(r)}{X_1(r) + X_2(r)} \\ \frac{X_1(r)}{X_1(r) + X_2(r)} \end{pmatrix} \forall r$ 3. Repeat until convergence or the iteration number reaches the maximum (by default 100):

a. Update $X \leftarrow VX$ b. Set $X(rt) = \begin{cases} \begin{pmatrix} 1 \\ 0 \end{pmatrix}, & \text{if } X_1(r) < X_2(r) \\ \begin{pmatrix} 0 \\ 1 \end{pmatrix}, & \text{otherwise} \end{cases}, \forall r$ In Step 2 and Step 3, convergence is declared when the relative error of X at two consecutive iterations (denoted by $X^{k-1}$ and $X^k$) is smaller than a pre-defined threshold $\varepsilon$, i.e.

$$\frac{\|X^k - X^{k-1}\|}{\|X^{k-1}\|} < \varepsilon.$$

The final phasor is $$P(r) = X(r)^T \begin{bmatrix} P_1(r) \\ P_2(r) \end{bmatrix} \forall r.$$

Water and fat can then be separated by solving a pair of linear equations.

$$W' + c_1 F' = S_1,$$

$$W' + c_2 F' = S_2 P^*, \quad [10]$$

where $W' = We^{i\Phi_1}$ and $F' = Fe^{i\Phi_1}$ are complex-valued water and fat signals.

An embodiment shares some similarity with the power method commonly used for eigenvalue decomposition or principal component analysis. If Eq. (6) is relaxed and modified as:

maximize $X^T(-V)X$ subject to $\|X\|=1$, [11]

then the problem reduces to finding the eigenvector corresponding to the largest eigenvalue of $-V$, which can be solved efficiently by a power method. Specifically, the leading eigenvector X of $-V$ can often be calculated iteratively by repeating the following steps:

1. $X \leftarrow (-V)X$
2. Normalize X.

The problem described in Eq. (6) adds an additional binary constraint for the choice of X to Eq. (11). In the proposed algorithm, Step 2 serves as an intermediate step, which is equivalent to normalizing X at each image pixel (instead of the entire vector), and Step 3 enforces the actual binary constraint. Therefore, the embodiment is defined as a projected power method.

In certain clinical applications, such as dynamic contrast-enhanced (DCE) MRI or cardiac cine MRI, dual-echo Dixon imaging needs to be repeatedly performed at different time points (contrast phases or cardiac phases). In these cases, water/fat separation is usually performed separately at each time point, which makes it susceptible to global water/fat swaps at certain time points. As the field map varies smoothly both in space and time, the discontinuity cost function in Eq. (5) can also include the time dimension. An embodiment can be easily extended to dynamic MRI applications by including neighboring pixels in both time and space. In fact, a smaller neighborhood in time is usually needed. For the dynamic applications in this embodiment, 58 neighboring pixels in total (56 in space and 2 in time) were applied by default, as shown in FIG. 2.

A summary of the overall workflow for water/fat separation in dual-echo Dixon imaging is as follows: Dual-echo Dixon imaging is commonly accelerated using parallel imaging and/or compressed sensing. For accelerated datasets, parallel imaging and/or compressed sensing reconstruction is performed prior to water/fat separation. SENSE type of reconstruction already includes phase-preserved coil combination in the reconstruction. For other coil-by-coil reconstructions, such as GRAPPA and ARC, a final SENSE-type coil combination (with an acceleration factor of 1) is required to preserve the phase information for water/fat separation. In this case, coil sensitivity maps need to be estimated and applied for both echoes.

As field inhomogeneity is smooth, the original images can be downsampled to low-resolution images to speed up the reconstruction. In this embodiment, all images are downsampled to a voxel size of 6×6×6 mm³ for example.

Eq. (3) is solved to obtain two phasor candidates. Then the projected power method of this embodiment is performed to select the correct phasor candidate.

The resolved phase error is spatially smoothed then upsampled back to the original voxel size, followed by water/fat separation in Eq. (10).

With institutional review board approval and informed patient consent/assent, all the following dual-echo Dixon datasets were acquired on 3T GE MR750 scanners (GE Healthcare, Waukesha) using dual-echo 3D spoiled-gradient echo sequences with DISCO, variable density Poisson disk, or variable density radial view ordering sampling patterns.

TABLE 1

Patient Demographics, Acquisition Parameters, and Reconstruction Times for High-Resolution 3D Datasets

|  | Chest | Foot | Leg |
| --- | --- | --- | --- |
| Age (years) | 13 | 7 | 0.7 |
| TE1/TE2 (ms) | 1.3/2.2 | 2.2/3.3 | 2.2/3.3 |
| TR (ms) | 4.1 | 6.7 | 5.9 |
| FOV (cm³) | 40 × 40 × 23 | 20 × 20 × 10 | 30 × 30 × 23 |

TABLE 1-continued

Patient Demographics, Acquisition Parameters, and Reconstruction Times for High-Resolution 3D Datasets

|  | Chest | Foot | Leg |
|---|---|---|---|
| In-plane matrix[a] | 320 × 320 | 354 × 224 | 354 × 320 |
| Number of slices | 152 | 200 | 460 |
| Receive coil | 32ch Cardiac | 8ch Foot | 32ch Cardiac |
| Phasor selection time | 9 | 1 | 6 |
| Total recon time (s) | 48 | 59 | 126 |

[a]All in-plane image matrices were zero-padded to 512 × 512 prior to the water/fat separation reconstruction.

Patient demographics and acquisition parameters are listed in Table 1. As summarized in the overall water/fat separation workflow, coil combination, downsampling, phasor selection, and upsampling were sequentially performed for the embodiment. Both the 1-peak fat model and 6-peak fat model were applied, with the corresponding dephasing factors calculated from Eq. (2).

To investigate the feasibility of joint space-time water/fat separation on dynamic MRI applications, a representative 3D breast DCE MRI is demonstrated. Patient demographics and acquisition parameters are listed in Table 2. The embodiment with the default parameters (unity phasor initialization, downsampling/upsampling, 200 iterations in total, and 58 neighboring pixels in space and time) and the 6-peak fat model was performed.

TABLE 2

Patient Demographics, Acquisition Parameters, and Reconstruction Times for Dynamic 3D Datasets

|  | Breast DCE |
|---|---|
| Gender | F |
| Age (years) | 68 |
| TE1/TE2 (ms) | 2.2/3.3 |
| TR (ms) | 6.2 |
| FOV (cm$^3$) | 30 × 36 × 19 |
| In-plane matrix | 416 × 386 |
| Number of slices | 192 |
| Receive coil | 16ch Breast |
| Number of phases (contrast or | 19 |
| Phasor selection time per phase | 33 |
| Total recon time per phase (s) | 37 |

To reduce the reconstruction time, coil compression (with six virtual coils) was applied to all datasets at the beginning of the reconstruction prior to parallel imaging and compressed sensing reconstruction and water/fat separation. To preserve the phase between two echoes, the same coil compression matrices were applied to data from both echoes. Depending on the sampling pattern, ARC, ESPIRiT, or compressed sensing parallel imaging reconstruction was performed to reconstruct the undersampled datasets. When applicable, SENSE-type coil combination (with an acceleration factor of 1) was performed on the virtual coils prior to the water/fat separation. For the 3D dual-echo Dixon datasets, the embodiment was implemented in C/C++. For the dynamic dual-echo Dixon dataset, the embodiment was performed in MATLAB (The Mathworks, Natick, Mass.). All reconstructions were performed on a PC with two Intel Xeon E5-2640 processors and 64 GB DRAM. Reconstruction times for phasor selection and the entire water/fat separation reconstruction times were recorded.

The reconstruction times for phasor selection and the entire water/fat separation is shown in Table 1. Fast reconstruction times were achieved for all 3D datasets. Examples of water and fat images using the embodiments are shown in FIG. 3a (chest), FIG. 3b (foot), and FIG. 3c (leg).

Figure 3:
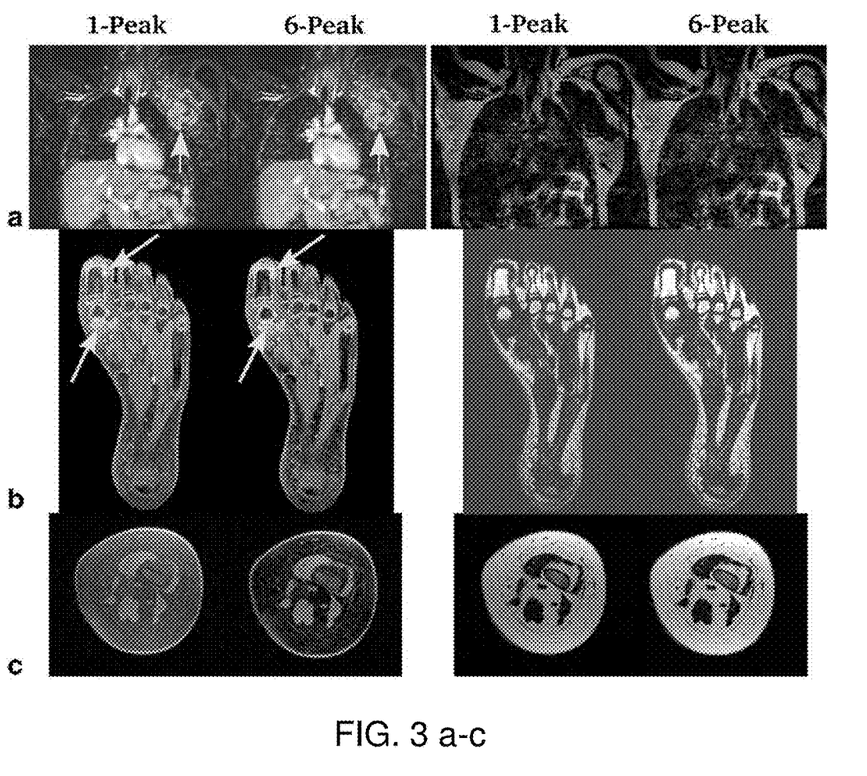
FIG. 3a, FIG. 3b, and FIG. 3c, show water/fat separation results of the chest, foot, and leg.

FIG. 3a, FIG. 3b, and FIG. 3c show water/fat separation results of the chest (FIG. 3a), foot (FIG. 3b), and leg (FIG. 3c) datasets using the projected power method with both the 1-peak fat model and 6-peak fat model showing water in the images on the left and fat in the images on the right. No global or local water/fat swap was observed in any case. Significantly better water/fat separation was achieved in FIG. 3b and FIG. 3c when the 6-peak fat model was applied. Soft tissue tumor (arrows) is well delineated in the upper left chest in FIG. 3a. Synovial inflammation is well seen in the water images in FIG. 3b. No global or local water/fat swaps were observed for the 1-peak fat model (dephasing factors calculated from Eq. (2)) and the 6-peak fat model. Significant better water/fat separation results were achieved using the 6-peak fat model in the foot and leg datasets.

The reconstruction times for phasor selection and the entire water/fat separation using the embodiment are shown in Table 2. The embodiment was slower due to the non-optimized implementation in MATLAB compared to the C/C++ implementation for the 3D datasets. Examples of water and fat images are shown in FIG. 4 (breast DCE).

Figure 4:
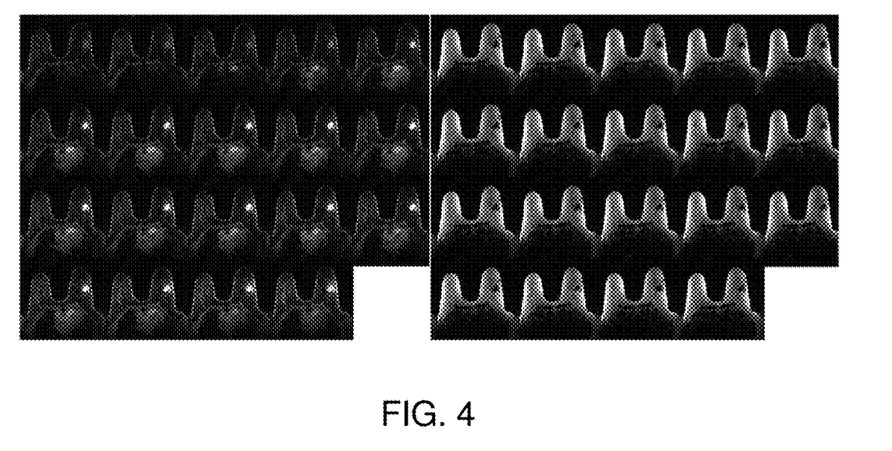
FIG. 4 shows water/fat separation results of a breast DCE dataset.

FIG. 4 shows water/fat separation results of the breast DCE dataset for all contrast phases using the 6-peak fat model. Water is shown in the image on the left. Fat is shown in the image on the right. Excellent water/fat separation was achieved using the embodiment. No global or local water/fat swaps were observed at any contrast phase. Contrast dynamics of the tumor in the left breast is well captured.

Resolving phase ambiguity is a crucial step in dual-echo Dixon imaging. Inaccurate phase error estimation can lead to global and/or local water/fat swaps. In the embodiments, the phase estimation was formulated as a binary quadratic optimization, and a projected power method was used to achieve fast phase error estimation. As demonstrated, the computational complexity of VX is proportional to the number of neighboring pixels in $N_r$, and therefore, is $O(N_r N)$ (where N is the total number of pixels and $N_r$ is the number of neighboring pixels). Down sampling, assuming the phase inhomogeneity is smooth, reduces N and hence the phasor selection time. As the number of neighboring pixels only increased from 56 to 58 when the projected power method was extended from 3D to 4D in dynamic MRI applications, faster reconstruction times are expected using the embodiment when implemented in C/C++. The advantage of this extension is that field inhomogeneity is also enforced to be smoothly varying in time, preventing global water/fat swaps in single time points, which is more likely to happen if water/fat separation is performed independently at each time point.

The main reconstruction parameters of the embodiment are the initial phasor, the downsampled voxel size, the neighboring pixel set, and the iteration number. The phasor was initialized as unity (zero phase error) in the embodiment, relying on a reasonable shimming. The down sampled voxel size and the number of iterations were empirically determined based on representative 3D data sets and kept constant for all datasets included in this embodiment. Automatic reconstruction parameter determination may be used in other embodiments.

In this work, a binary quadratic optimization program has been formulated to resolve the phase ambiguity in dual-echo Dixon imaging. A projected power method has been developed to efficiently solve the binary quadratic optimization.

Fast reconstruction times and robust water/fat separation have been achieved for high dimensional datasets by the embodiment.

APPENDIX: FAST CALCULATION OF VX

For simplicity, only the point-wise operations of VX in one-dimensional datasets are demonstrated in this appendix. Consider the scenario where $N_y = N_z = 1$, in which case X reduces to a $2N_x$-dimensional vector. Here, it is assumed that the neighboring pixel set $N_r$ of r consists only of its nearest neighbors, i.e., $N_r = \{r-1; r+1\}$. Based on the definition of $$X(r) = \begin{pmatrix} X_1(r) \\ X_2(r) \end{pmatrix},$$

X is decomposed into two components $$X_1 := |X_1(r)|_{1 \leq r \leq N_x} \text{ and } X_2 := |X_2(r)|_{1 \leq r \leq N_x}. \quad [A1]$$

where both $X_1$ and $X_2$ are $N_x$-dimensional vectors, representing the binary selection of $P_1$ and $P_2$, respectively. In addition, we set $X' := VX \in \mathbb{R}^{2N_x}$, for simplicity, and decouple $X'$ into two components $X'_1$ and $X'_2$, similar to Eq. (A1).

The computation of $X'$ relies on pointwise multiplication with the following phasor difference matrices $D_1, \ldots, D_4 \in \mathbb{R}^{N_x - 1}$:

$$D_1 := |v(P_1(r), P_1(r+1))|_{1 \leq r \leq N_x}$$

$$D_2 := |v(P_1(r), P_2(r+1))|_{1 \leq r \leq N_x}$$

$$D_3 := |v(P_2(r), P_1(r+1))|_{1 \leq r \leq N_x}$$

$$D_4 := |v(P_2(r), P_2(r+1))|_{1 \leq r \leq N_x} \quad [A2]$$

Specifically, if we define $W(i:j) := |W_l|_{i \leq l \leq j}$ for any vector W and denote $$X'_{1,1} = X'_1(1:N_x - 1),$$

$$X'_{1,2} = X'_1(2:N_x),$$

$$X_{1,1} = X_1(1:N_x - 1),$$

$$X_{1,2} = X_1(2:N_x),$$

$$X_{2,1} = X_2(1:N_x - 1),$$

$$X_{2,2} = X_2(2:N_x), \quad [A3]$$

then $X'$ can be calculated by (1) initialize $X'$ to be zero, and (2) sequentially implement the following update rules:

$$X'_{1,1} \leftarrow X'_{1,1} + X_{1,2} \circ D_1 + X_{2,2} \circ D_2,$$

$$X'_{1,2} \leftarrow X'_{1,2} + X_{1,1} \circ D_1 + X_{2,1} \circ D_3,$$

$$X'_{2,1} \leftarrow X'_{2,1} + X_{1,2} \circ D_3 + X_{2,2} \circ D_4,$$

$$X'_{2,2} \leftarrow X'_{2,2} + X_{1,1} \circ D_2 + X_{2,1} \circ D_4,$$

where ° represents the Hadamard product (entry-wise matrix multiplication). This allows us to obtain $X' = VX$ within linear time.

This embodiment can be easily extended to larger-dimensional datasets in other embodiments. When a larger neighboring pixel set is employed, more difference matrices $\{D_i\}$ need to be included in [A4]; in fact, for the neighborhood $N_r = \{s : d(r,s) \leq \sqrt{5}\}$ (56 pixels in 3D) applied in this embodiment, 112 such difference matrices are included. As demonstrated in [A4], the computation of $X \leftarrow VX$ can be completed in time $O(N_r N)$, where $N_r$ is the neighborhood size and N the total number of image pixels.

Some embodiments are further explained in the article "Resolving Phase Ambiguity in Dual-Echo Dixon Imaging Using a Projected Power Method," by Tao Zhang, Yuxin Chen, Shanshan Bao, Marcus T Alley, John M. Pauly, Brian Hargreaves, and Shreyas S. Vasanawala, in Magnetic Resonance in Medicine DOI 10.1002/mrm.26287, which is incorporated by reference for all purposes.

Figure 5:
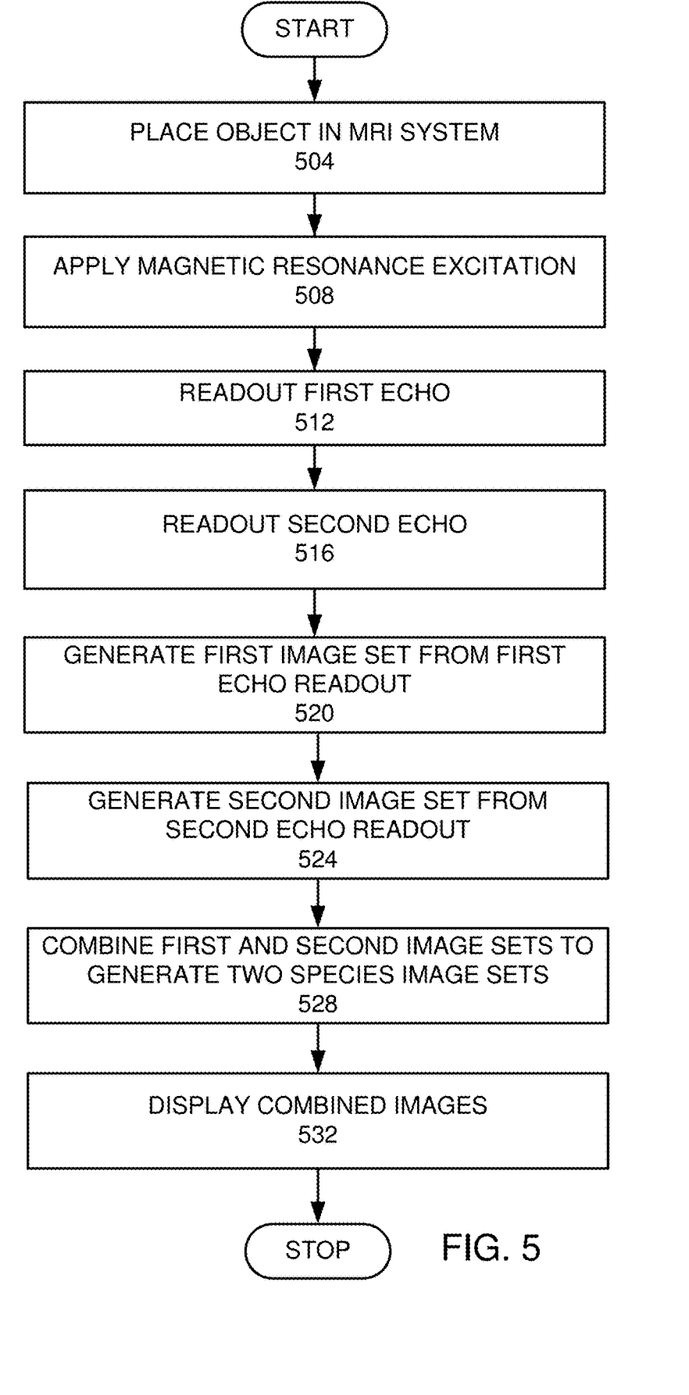
FIG. 5 is a flow chart of a process used in an embodiment of the invention.

To facilitate the understanding of the invention, FIG. 5 is a high-level flow chart of an embodiment of the invention. An object is placed in an MRI system (step 504). An MRI excitation is applied to a volume of the object in the MRI system (step 508). A first echo readout is obtained (step 512). A second echo readout is obtained (step 516). A first image set is generated from the first echo readout (step 520). A second image set is generated from the second echo readout (step 524). The first image set and second image set are combined to generate a first combined image of the concentration of only a first species and a second combined image of the concentration of only a second species (step 528). The first combined image and/or the second combined image are displayed (step 532).

Figure 6:
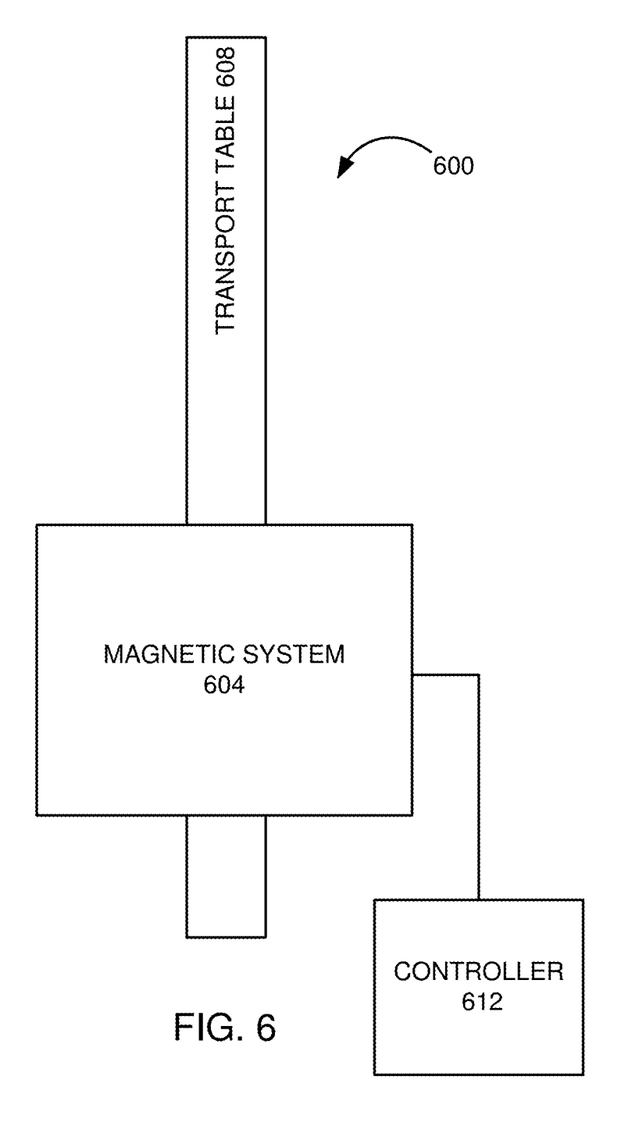
FIG. 6 is a schematic top view of a magnetic resonance imaging (MRI) system that may be used in an embodiment of the invention.

In a more detailed description of an embodiment, an object is placed in an MRI system (step 504). FIG. 6 is a schematic top view of a magnetic resonance imaging (MRI) system 600 that may be used in an embodiment of the invention. The MRI system 600 comprises a magnet system 604, a patient transport table 608 connected to the magnet system, and a controller 612 controllably connected to the magnet system. In one example, an object, such as a patient, would lie on the patient transport table 608 and the magnet system 604 would pass around the patient. The controller 612 would control magnetic fields and radio frequency (RF) signals provided by the magnet system 604 and would receive signals from detectors in the magnet system 604.

Figure 7:
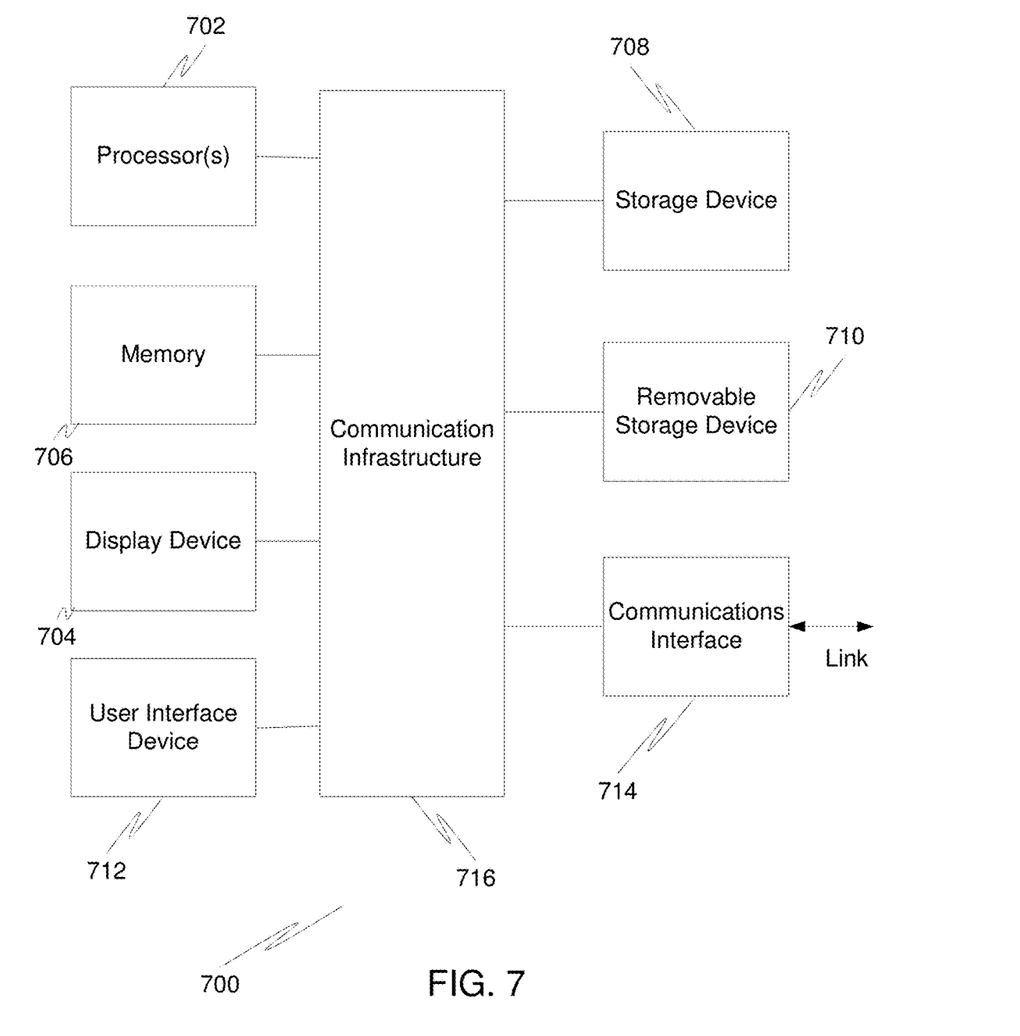
FIG. 7 is a high-level block diagram showing a computer system.

FIG. 7 is a high-level block diagram showing a computer system 700, which may be used to provide the controller 612. The computer system may have many physical forms ranging from an integrated circuit, a printed circuit board, and a small handheld device up to a computer. The computer system 700 includes one or more processors 702, and further can include an electronic display device 704, a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) to which the aforementioned devices/modules are connected.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 8:
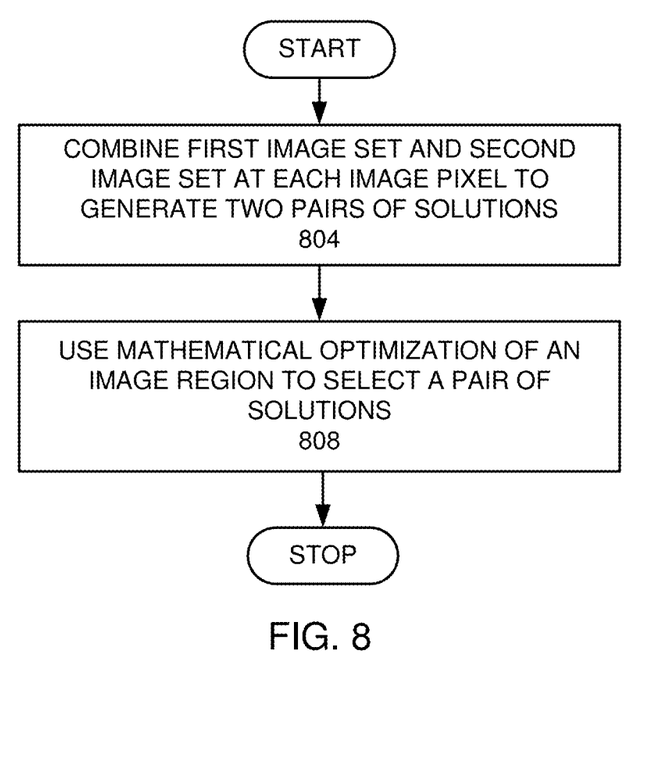
FIG. 8 is a more detailed flow chart of a combining step.

An MRI excitation is applied by the MRI system 600 to a volume of the patient on the patient transport table 608 (step 508). A first echo readout of the volume is obtained by the MRI system 600 (step 512). A second echo readout of the volume is obtained by the MRI system (step 516). In an embodiment, the first echo readout and the second echo readout may be at different times after the same MRI excitation. In another embodiment, another MRI excitation may be provided between the first echo readout and the second echo readout. However, the echo time of the second readout after the second MRI excitation must be different than the echo time between the first MRI excitation and the first echo readout, to allow for different echo times and different readout phases. The entire volume may be imaged by further repeating the MRI excitation, first echo readout, and second echo readout. The echo times are consistent for each repetition, causing the timing between the excitation and the first echo readout and the second echo readout to be consistent for each repetition, as known in the art for Dixon imaging. A first image set is generated from the first echo readout with each first image set pixel being a first linear combination of a concentration of a first species and a second species (step 520). A second image set is generated from the second echo readout with each second image set pixel being a second linear combination of the concentration of the first species and second species (step 524). When the MRI excitation, first echo readout, and second echo readout are repeated a plurality of times, the first image set may further include data from multiple first echo readouts and the second image set may further include data from multiple second echo readouts. The first image set and second image set are combined to generate a first combined image of the concentration of only the first species and a second combined image of the concentration of only the second species (step 528). FIG. 8 is a more detailed flow chart of the step combining the first image set and the second image set (step 528). The first image set and the second image set are combined at each pixel to generate two pairs of solution, or two solution pairs (step 804). A mathematical optimization of an image region is used to select a solution pair from the two solution pairs, where the selected solution pair for a pixel is used to generate the first combined image containing only the first species and the second combined image containing only the second species (step 808).

The first combined image and/or the second combined image are displayed (step 532). In an embodiment, the first combined image and the second combined image are displayed in the display device 704, such as a monitor. In another embodiment, the display device 704 may be a printer, which prints out the first combined image and the second combined image.

As described above, various embodiments provide an optimization of a smooth magnetic field map in selection between two solutions provided in species separation, instead of low pass filtering process or a region growing process. The optimization allows the use of arbitrarily selected echo times instead of requiring echo times with a very specific phase difference to provide a specific linear combination of the species. In the Dixon method there may be additional sources of phase in addition to the phase difference caused by fat. In the prior art, the phase difference due to fat may need to be identified in order to prevent identification errors during water/fat separation. Otherwise, phase shift may cause misidentification of water or fat. Misidentification of water and fat may cause image artifacts. Various embodiments provide a binary constraint, which selects only one of the two pairs provided as possible solutions. In addition to increasing accuracy by reducing misidentification, various embodiments are able to provide results quickly with less processing power. The optimization satisfies a MRI signal equation between the first image set and the second image set as described in Eq. (1). Preferably, the optimization is a binary quadratic optimization.

In an embodiment, the first species is water and the second species is fat. In other embodiments, other species may be identified, such as the first species may be fat and the second species may be muscle.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for creating a first MRI image of an object in an MRI system indicating a first species and a second MRI image of the object indicating a second species, comprising:
   applying, through the MRI system, a radio frequency (RF) excitation of the object;
   reading out through the MRI system a first echo from the object;
   reading out through the MRI system a second echo of the object;
   using the first echo readout to generate a first image set, with each image pixel of a plurality of image pixels being a first linear combination of the first species and the second species;
   using the second echo readout to generate a second image set, with each image pixel being a second linear combination of the first species and the second species;
   combining the first image set and second image set to obtain a first combined image containing only the first species and a second combined image containing only the second species, comprising:
      combining the first image set and the second image set at each image pixel to generate two solution pairs at all of the image pixels of the plurality of pixels, wherein for each image pixel the two solution pairs have a first solution pair that represents the first species and the second species and a second solution pair that represents the first species and the second species, wherein at each image pixel the first species and second species are calculated together as a pair from the first image set and the second image set to yield the two solution pairs; and using a mathematical optimization of an image region to choose for each image pixel either the first solution pair or the second solution pair that represents the first species and the second species for all of the image pixels.

2. The method, as recited in claim 1, wherein the mathematical optimization is an optimization of all the image pixels.

3. The method, as recited in claim 2, wherein the mathematical optimization is a binary quadratic optimization.

4. The method, as recited in claim 3, wherein the mathematical optimization optimizes homogeneity of the magnetic field of the MRI system.

5. The method, as recited in claim 4, further comprising:
reading out through the MRI system a plurality of first echoes from the object;
reading out through the MRI system a plurality of second echoes from the object, wherein the first image set further comprises readout from the plurality of first echoes and the second image set further comprises readout from the plurality of second echoes.

6. The method, as recited in claim 5, wherein the mathematical optimization provides binary constraints.

7. The method, as recited in claim 6, wherein the mathematical optimization optimizes an objective function in the form of $f(x)=X^T V X$, wherein X is a binary vector and a value of each entry in X can only be 0 or 1, and V is a square matrix and a value of each entry in V represents the homogeneity of the magnetic field between two image pixels.

8. The method, as recited in claim 7, wherein the mathematical optimization satisfies a MRI signal equation between the first image set and the second image set.

9. The method, as recited in claim 1, wherein the mathematical optimization is a binary quadratic optimization.

10. The method, as recited in claim 1, wherein the mathematical optimization optimizes homogeneity of the magnetic field of the MRI system.

11. The method, as recited in claim 1, further comprising:
reading out through the MRI system a plurality of first echoes from the object;
reading out through the MRI system a plurality of second echoes from the object, wherein the first image set further comprises readout from the plurality of first echoes and the second image set further comprises readout from the plurality of second echoes.

12. The method, as recited in claim 1, wherein the mathematical optimization provides binary constraints.

13. A method for creating a first MRI image of an object in an MRI system indicating a first species and a second MRI image of the object indicating a second species, comprising:
applying, through the MRI system, a radio frequency (RF) excitation of the object;
reading out through the MRI system a first echo from the object;
reading out through the MRI system a second echo of the object;
using the first echo readout to generate a first image set, with each image pixel of a plurality of image pixels being a first linear combination of the first species and the second species;
using the second echo readout to generate a second image set, with each image pixel being a second linear combination of the first species and the second species;
combining the first image set and second image set to obtain a first combined image containing only the first species and a second combined image containing only the second species, comprising:
combining the first image set and the second image set at each image pixel to generate two solution pairs at all of the image pixels of the plurality of pixels, wherein for each image pixel the two solution pairs have a first solution pair that represents the first species and the second species and a second solution pair that represents the first species and the second species, wherein at each image pixel the first species and second species are calculated together as a pair from the first image set and the second image set to yield the two solution pairs; and
using a mathematical optimization of an image region to choose for each image pixel either the first solution pair or the second solution pair that represents the first species and the second species for all of the image pixels, wherein the mathematical optimization optimizes an objective function in the form of $f(x)=X^T V X$, wherein X is a binary vector and a value of each entry in X can only be 0 or 1, and V is a square matrix and a value of each entry in V represents the homogeneity of the magnetic field between two image pixels.

14. The method, as recited in claim 1, wherein the mathematical optimization satisfies a MRI signal equation between the first image set and the second image set.

15. A method for creating a first MRI image of an object in an MRI system indicating a first species and a second MRI image of the object indicating a second species, comprising:
applying, through the MRI system, a plurality of radio frequency (RF) excitations of the object;
reading out through the MRI system a plurality of first echoes from the object;
reading out through the MRI system a plurality of second echoes of the object;
using the readout of plurality of first echoes to generate a first image set, with each image pixel of a plurality of image pixels of the first image set being a first linear combination of the first species and the second species;
using the readout of the plurality of second echoes to generate a second image set, with each image pixel of the plurality of image pixels of the second image set being a second linear combination of the first species and the second species;
combining the first image set and second image set to obtain a first combined image containing only the first species and a second combined image containing only the second species, comprising:
combining the first image set and the second image set at each image pixel to generate two solution pairs at all of the image pixels of the plurality of pixels, wherein for each image pixel the two solution pairs have a first solution pair that represents the first species and the second species and a second solution pair that represents the first species and the second species, wherein at each image pixel the first species and second species are calculated together as a pair from the first image set and the second image set to yield the two solution pairs; and
using a mathematical optimization of an image region to choose for each image pixel either the first solution pair or the second solution pair that represents the first species and the second species for all of the image pixels.

16. The method, as recited in claim 15, wherein the mathematical optimization is an optimization of all the image pixels.

17. The method, as recited in claim 15, wherein the mathematical optimization is a binary quadratic optimization.

18. The method, as recited in claim 15, wherein the mathematical optimization optimizes homogeneity of the magnetic field of the MRI system.

* * * * *